(12) United States Patent
Fontana et al.

(10) Patent No.: US 12,211,772 B2
(45) Date of Patent: Jan. 28, 2025

(54) METHOD OF MANUFACTURING SEMICONDUCTOR DEVICES AND CORRESPONDING SEMICONDUCTOR DEVICE

(71) Applicants: STMicroelectronics S.r.l., Agrate Brianza (IT); STMicroelectronics, Inc., Calamba (PH)

(72) Inventors: Fulvio Vittorio Fontana, Monza (IT); Davide Maria Benelli, Crema (IT); Jefferson Sismundo Talledo, Laguna (PH)

(73) Assignees: STMicroelectronics S.r.l., Agrate Brianza (IT); STMicroelectronics, Inc., Calamba (PH)

( * ) Notice: Subject to any disclaimer, the term of this patent is extended or adjusted under 35 U.S.C. 154(b) by 396 days.

(21) Appl. No.: 17/688,013

(22) Filed: Mar. 7, 2022

(65) Prior Publication Data
US 2022/0293498 A1    Sep. 15, 2022

(30) Foreign Application Priority Data

Mar. 11, 2021 (IT) ............... 102021000005759

(51) Int. Cl.
*H01L 23/495* (2006.01)
*H01L 21/56* (2006.01)
(Continued)

(52) U.S. Cl.
CPC ...... *H01L 23/49541* (2013.01); *H01L 21/565* (2013.01); *H01L 23/16* (2013.01);
(Continued)

(58) Field of Classification Search
CPC ................................. H01L 23/49894
See application file for complete search history.

(56) References Cited

U.S. PATENT DOCUMENTS 9,824,956 B2 * 11/2017 Fontana ............. H01L 23/4952
2011/0248393 A1 * 10/2011 Lu ........................ H01L 24/29
257/676

(Continued)

FOREIGN PATENT DOCUMENTS

EP    3098841 A1    11/2016
JP    S60195955 A   10/1985

OTHER PUBLICATIONS

EP Search Report and Written Opinion for counterpart EP Appl. 22160653.6, report dated Aug. 25, 2022, 9 pgs.
(Continued)

*Primary Examiner* — Yu-Hsi D Sun
(74) *Attorney, Agent, or Firm* — Crowe & Dunlevy LLC (57) ABSTRACT

A semiconductor device, such as a Quad-Flat No-lead (QFN) package, includes a semiconductor chip arranged on a die pad of a leadframe. The leadframe has an array of electrically-conductive leads around the die pad. The leads in the array have distal ends facing away from the die pad as well as recessed portions at an upper surface of the leads. Resilient material, such as low elasticity modulus material, is present at the upper surface of the leads and filling the recessed portions. An insulating encapsulation is molded onto the semiconductor chip. The resilient material is sandwiched between the insulating encapsulation and the distal ends of the leads. This resilient material facilitates flexibility of the leads, making them suited for reliable soldering to an insulated metal substrate.

28 Claims, 12 Drawing Sheets

(51) Int. Cl.
  *H01L 23/16*  (2006.01)
  *H01L 23/31*  (2006.01)
  *H01L 23/00*  (2006.01)
(52) U.S. Cl.
  CPC .......... *H01L 23/3114* (2013.01); *H01L 24/32* (2013.01); *H01L 24/48* (2013.01); *H01L 2224/32245* (2013.01); *H01L 2224/48245* (2013.01)

(56) References Cited

U.S. PATENT DOCUMENTS

2013/0277817 A1    10/2013  Takeuchi
2019/0279921 A1*    9/2019  Kadoi ............... H01L 23/49503

OTHER PUBLICATIONS

IT Search Report and Written Opinion for priority application, IT Appl. No. 102021000005759, report dated Nov. 11, 2021, 8 pages.

* cited by examiner

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102020000005759, filed on Mar. 11, 2021, the content of which is hereby incorporated by reference in its entirety to the maximum extent allowable by law.

TECHNICAL FIELD

The description relates to semiconductor devices.

One or more embodiments can be applied advantageously to semiconductor devices for the automotive and consumer mass market.

BACKGROUND

A so-called insulated metal substrate (IMS) is frequently used in lieu of a conventional printed circuit board (PCB) as an insulated metal card (IMC), for applications—in the automotive sector, for instance—where high thermal power is desired to be dissipated by a semiconductor device package.

It is noted that a package such as a Quad-Flat No-lead (QFN) module on IMS may exhibit a high coefficient of thermal expansion (CTE) and produce high stresses transmitted to the QFN module solder joint. A thin organic layer is not enough to relieve stress.

As a result, large QFN modules (7×7 mm or 10×10 mm, for example) may fail to meet reliability criteria (solder joint failure at BLR/thermal cycle or Thermal Shocks and Card Bending).

This suggests that Quad Flat Package (QFP) modules should be used in the place of QFN modules, which in turn may result in a larger space undesirably occupied on the board.

There is a need in the art to address the issues discussed in the foregoing.

SUMMARY

One or more embodiments may relate to a method.

One or more embodiments may relate to a corresponding semiconductor product.

One or more embodiments may involve a QFN manufacturing method that facilitates increased lead flexibility.

In one or more embodiments a low elasticity modulus mass is interposed between leads and molding at lead tips.

One or more embodiments facilitate using large QFN packages (10×10 mm, for instance) on an insulated metal substrate (IMS).

Those of skill in the art will otherwise appreciate that, while particularly advantageous results can be achieved in connection with QFN packages, the embodiments as discussed herein are not limited to use in connection with QFN packages.

BRIEF DESCRIPTION OF THE DRAWINGS

One or more embodiments will now be described, by way of example only, with reference to the annexed figures, wherein.

It will be appreciated that, for the sake of simplicity and ease of explanation, the various figures may not be drawn to a same scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" within the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

It will be appreciated that, unless the context indicates otherwise, like parts or elements are indicated throughout the figures with like reference symbols, and a detailed description will not be repeated for each and every figure for brevity.

A possible drawback encountered with Quad-Flat No-lead (QFN) modules when used in connections with insulated metal cards (IMCs) is related with card materials. The desire of achieving a high thermal power dissipation involves using thick cards made of, e.g., copper with a thin layer of dielectric.

Figure 1:
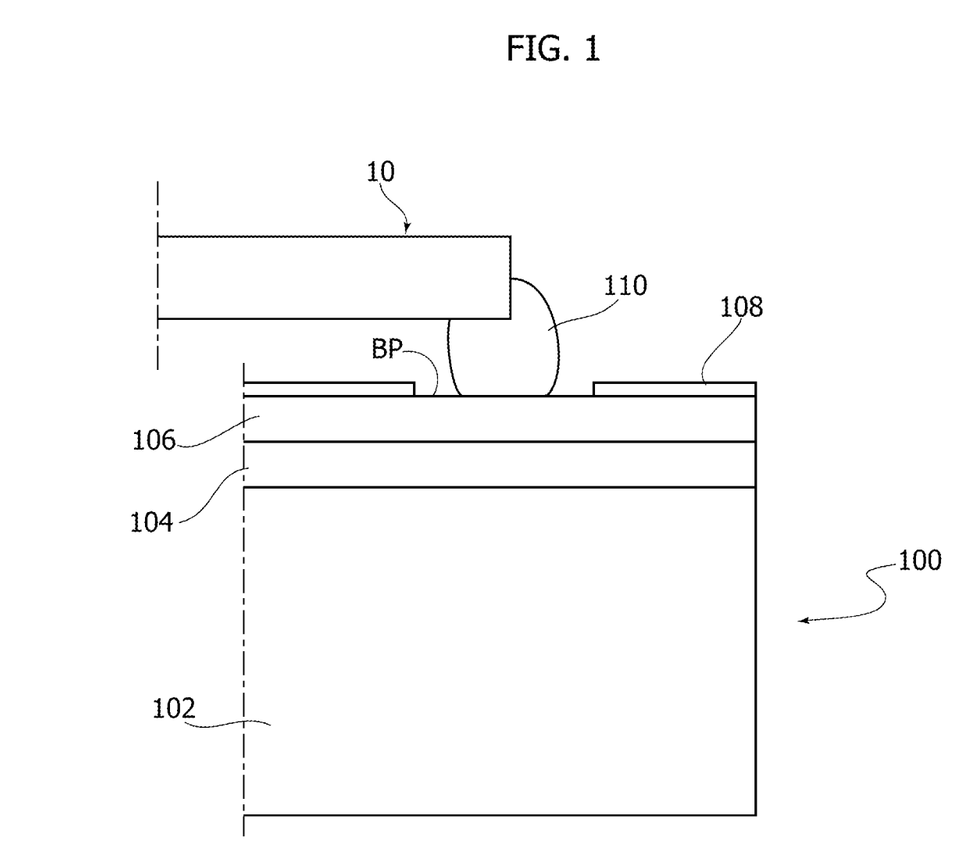
FIG. 1 is exemplary of an arrangement including a conventional Quad-Flat No-lead (QFN) package mounted on an insulated metal card (IMC)

FIG. 1 is exemplary of such an arrangement including a QFN package 10 mounted on an IMC 100 having a layered structure including a base copper layer (1100 H1/2) 102, a dielectric layer 104, a top copper layer 106 and a solder mask 108 into which a bond pad BP is formed to facilitate the provision of a solder joint 110 for the package 10.

Such a thick copper card inevitably exhibits a high coefficient of thermal expansion (CTE) and high stresses transmitted to the solder joint 110 with the QFN package 10. The thin organic layer 104 is not enough to relieve stress.

For instance, results board level reliability (BLR) simulation done on a QFN 7×7 module shows a possible lifetime drop to a maximum of 279 cycles in comparison with 1368 cycles for a QFN 7×7 on a FR4 multilayer board.

An approach to address these issues may involve using Thin Quad Flat Package (TQFP) modules with flexible contacts capable of relieving thermomechanical stresses.

Another approach may involve using copper cards with a thicker PCB interposer to relieve the stress.

These approaches are not exempt from drawbacks. For instance: TQFP packages may take more card space compared to a QFN; and a thicker PCB interposer may undesirably increase the cost of the card.

To summarize: a QFN package 10 assembled on an IMS copper card 100 as illustrated in FIG. 1 has a (much) worse Temperature Cycle on Board (TCoB) performance compared to a multi-layer PCB card assembly; and the "critical" solder joint 110 may end up by being located at the package corner insofar as corner lead design in a QFN package helps to improve TCoB reliability of the critical solder joint.

Figure 2:
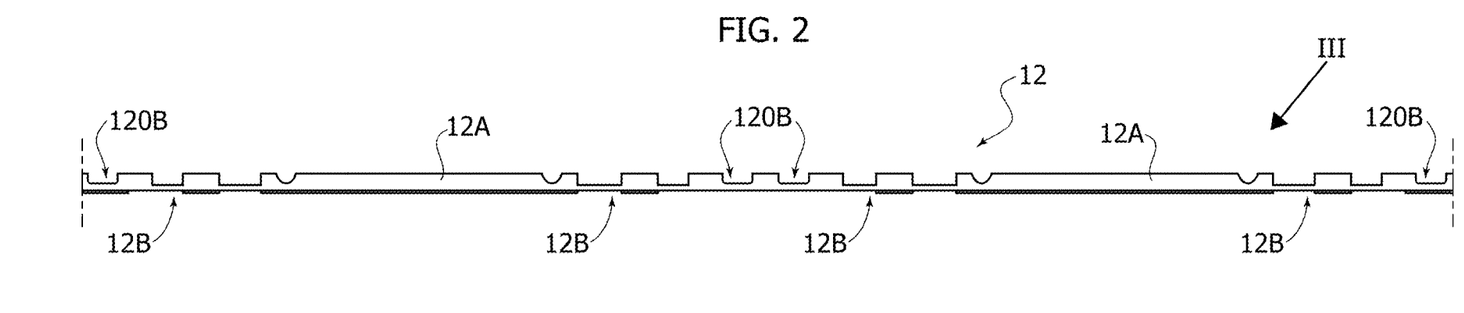
FIG. 2 is a cross-sectional view of a leadframe which can be used in embodiments according to the present description.

By referring now to FIG. 2, one or more embodiments may involve providing (in a semiconductor device package such as 10) a half-etched leadframe 12.

The designation leadframe (or lead frame) is currently used (see, for instance, the USPC Consolidated Glossary of the United States Patent and Trademark Office) to indicate a metal frame which provides (at a die pad or paddle, 12A) support for a semiconductor chip or die as well as electrical leads 12B to couple the semiconductor chip or die to other electrical components or contacts.

Essentially, a leadframe 12 comprises an array of electrically-conductive formations (leads) 12B which from a peripheral location extend inwardly in the direction of the semiconductor chip or die, thus forming an array of electrically-conductive formations from the die pad 12A having at least one semiconductor chip or die attached thereon.

It will be otherwise appreciated that the specification "No-leads" as applied to a QFN package is not in contradiction to the provision therein of a leadframe including leads: in fact, a key feature of a QFN package lies in that the leads therein do not protrude radially from the package, so that the (quad) package has "no leads" protruding therefrom.

Figure 3:
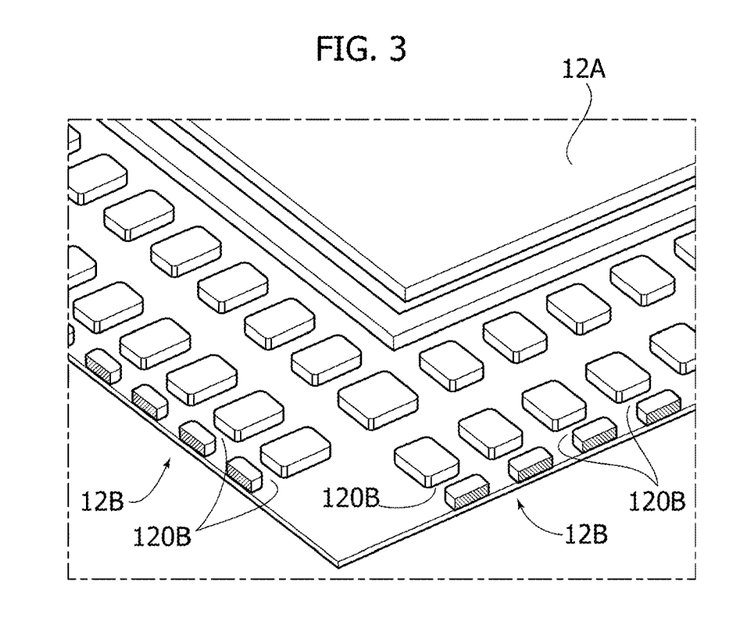
FIG. 3 is an enlarged perspective view substantially along arrow III in FIG. 3, FIGS. 4 and 5 illustrate possible method steps in embodiments according to the present description.

As visible in the enlarged partial view of FIG. 3, in one or more embodiments the external leads 12B in the leadframe have slots (recesses, openings) 120B formed therein near their distal ends. These slots 120B may be provided during formation of the leadframe 12 from a sheet or reel of material such as copper via a conventional etching process.

Adopting current language in etching technology, the slots 120B may be referred to as being "half-etched" in the leadframe material. However, this does not necessarily imply that the slots 120B have a depth equal to half the thickness of the leadframe 12.

Also, it will be appreciated that figures from FIG. 2 onwards may refer to manufacturing simultaneously plural devices 10 which are finally separated in a "singulation" step.

Figure 4:
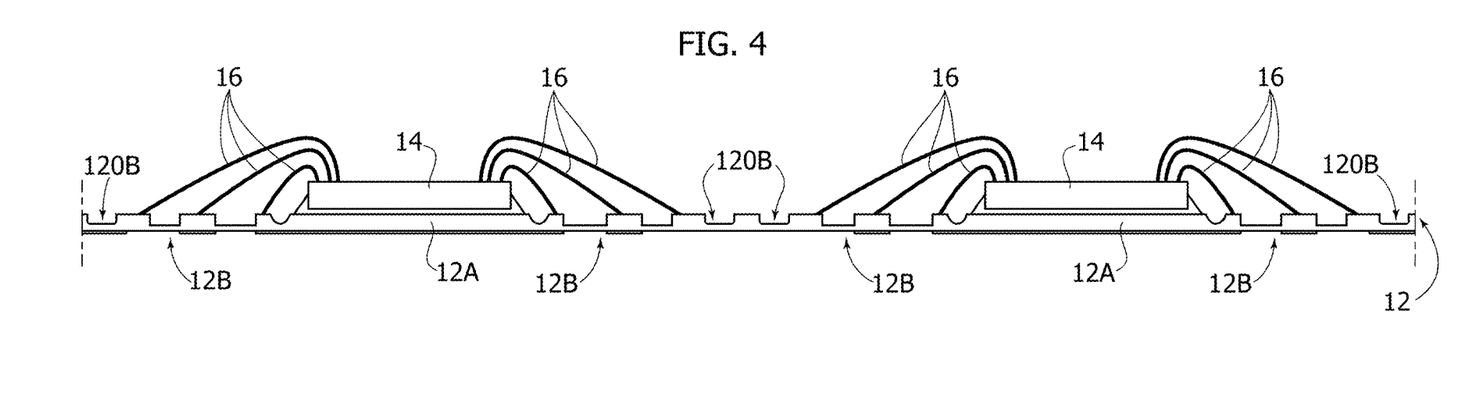

Semiconductor devices such as 10 comprise, in a manner known per se to those of skill in the art, one or more semiconductor chips or dice 14 arranged (attached, via a die attach material) on the die pads 12A of the leadframe 12 as exemplified in FIG. 4.

Electrical coupling of the leads 12B in the leadframe 12 with the semiconductor chip or die 14 may be via wires forming a wire-bonding pattern 16 around the chips or dice 14.

A device package may then be completed by an insulating encapsulation 18 formed by molding a compound such as an epoxy resin on the leadframe 12 and the semiconductor chip(s) 14 attached thereon (plus the wire bonding pattern 16).

Figure 5:
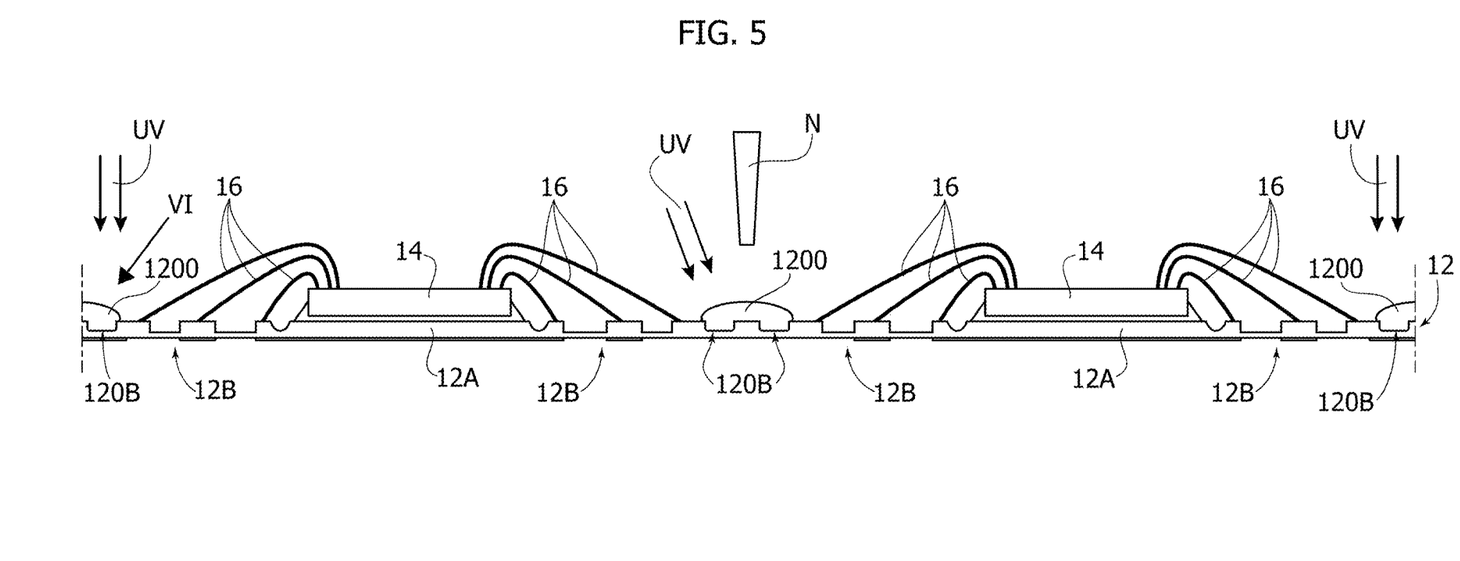
Figure 6:
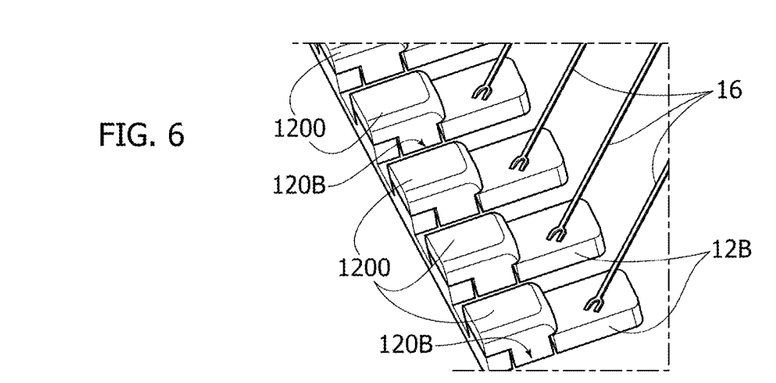
FIG. 6 is an enlarged perspective view substantially along arrow VI in FIG. 5, FIGS. 7 and 8 illustrate possible method steps in embodiments according to the present description.
Figure 7:
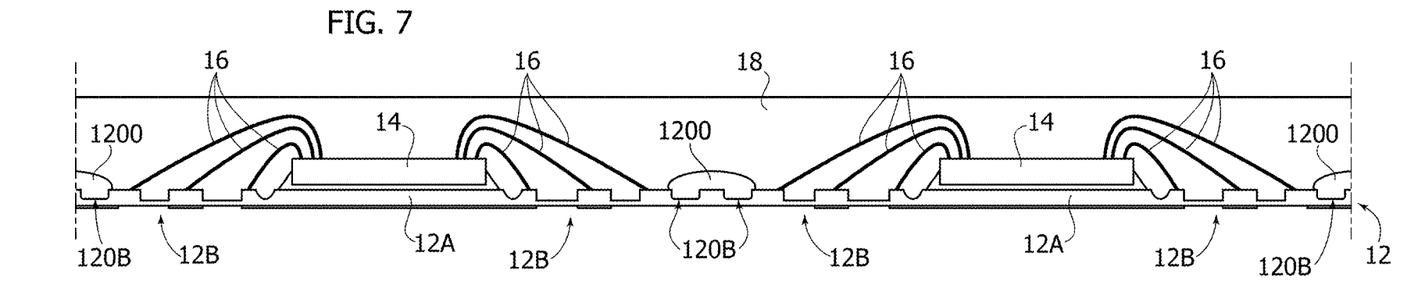

In one or more embodiments, such step or act as illustrated in FIG. 7 is preceded by the step or act illustrated in FIGS. 5 and 6, wherein a low elastic modulus (LEM) material 1200 is dispensed into the slots 120B.

The elastic modulus (or modulus of elasticity) is a physical entity—measured in $Nm^2$ or Pa, even if megapascals (MPa or $N/mm^2$) or gigapascals (GPa or $kN/mm^2$) are frequently used—which indicates the resistance of an object or a substance to being deformed (elastically, that is, non-permanently) in response to a stress applied to it. A stiffer material will thus have a higher elastic modulus and a softer material will thus have a lower elastic modulus.

The modified polycarbamin acid derivate material available under the commercial designation DELO DUALBOND BS3770 with DELO DUALBOND BS3770 DELO Industrie Klebstoffe GmbH & Co. KGaA of Gewerbegebiet Schoffelding, DELO-Allee 1, 86949 Windach, Germany—(see delo-adhesives.com) and having a Young's modulus of in the vicinity of (i.e., +/−3-5%) 2 MPa (Rheometer|400 nm|200 mW/$cm^2$|10 s|Plus|150° C.|40 min) was found to be adequate for use as a resilient material 1200 in one or more embodiments.

Other materials exhibiting similar performance and, more generally, other materials that the person skilled in the art would regard as resilient materials having a low elastic modulus (that is, easy deformability under stress) in the context of use considered herein can be used satisfactorily in the embodiments.

Examples of possible alternative materials include the material designated Master Bond Supreme 10 HT Epoxy Insulation Adhesive available with Master Bond Inc. of Hackensack, NJ 07601 USA (see masterbond.com) or the material designated Dymax 9037F Acrylated Insulant Adhesive available with Dymax Corporation of Torrington, CT 06790 USA (see dymax.com)

Materials as discussed above can be adequately applied at the slots 120B, via a dispensing needle as indicated at N in FIG. 5, and then cured, via ultraviolet (UV) curing for instance.

As illustrated in FIG. 6, the material 1200 can be dispensed with a thickness 0.1-0.2 mm and provide a sort of cushion or lining covering the front or top surface, and possibly the sides—see FIGS. 17 and 18, to be discussed later, of the leads 12B (at their distal ends).

As illustrated in FIG. 7 an insulating encapsulation 18 is formed by molding a compound such as an epoxy resin on the leadframe 12 and the semiconductor chip(s) 14 attached thereon (plus the wire bonding pattern 16) and the material 1200.

If not completed earlier, polymerization (curing) of the material 1200 can be completed (at a temperature of, e.g., 170° C.) together with curing of the insulating encapsulation 18.

Figure 8:
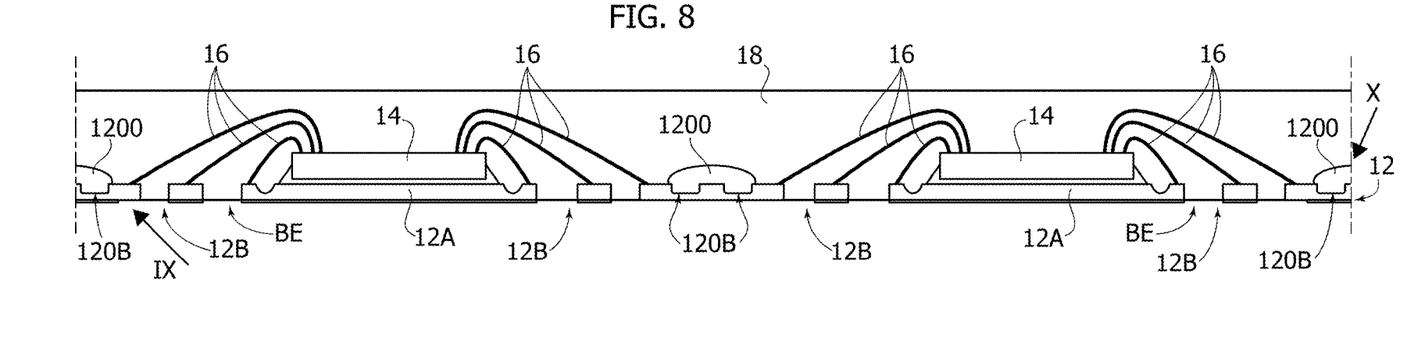
Figure 9:
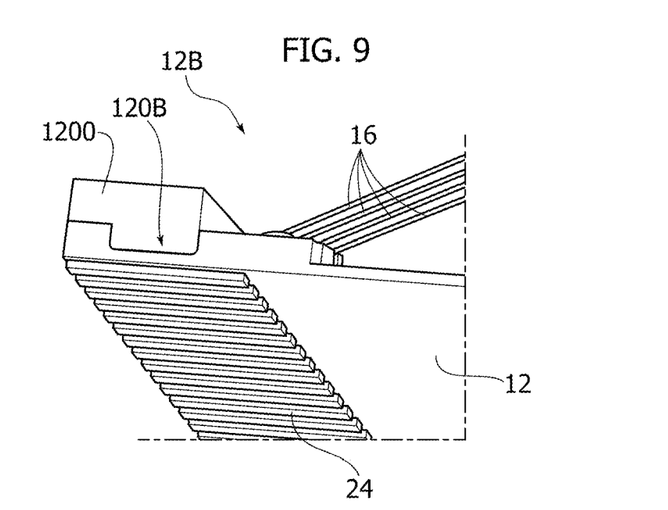
FIG. 9 is a perspective view substantially along arrow IX in FIG. 8.
Figure 10:
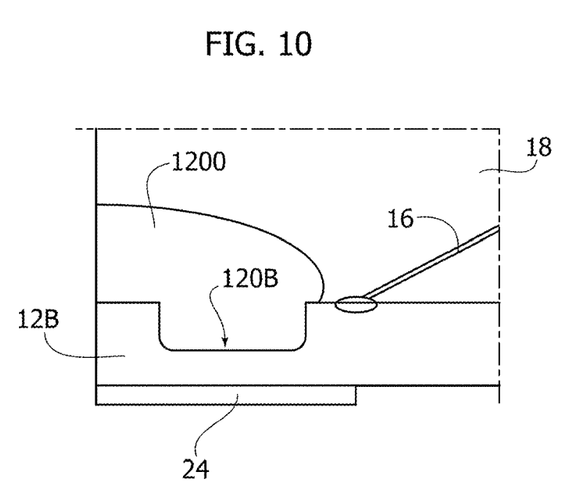
FIG. 10 is an enlarged view along arrow X in FIG. 8.

FIG. 8 is exemplary of (otherwise conventional) back etching applied at BE and of the possibility (see FIGS. 9 and 10) for a bottom plated area 24 at the leads 12B stopping before the top bonding area. It will be noted that the back etching does not reach the material 1200 filling the slots 120B.

Figure 11:
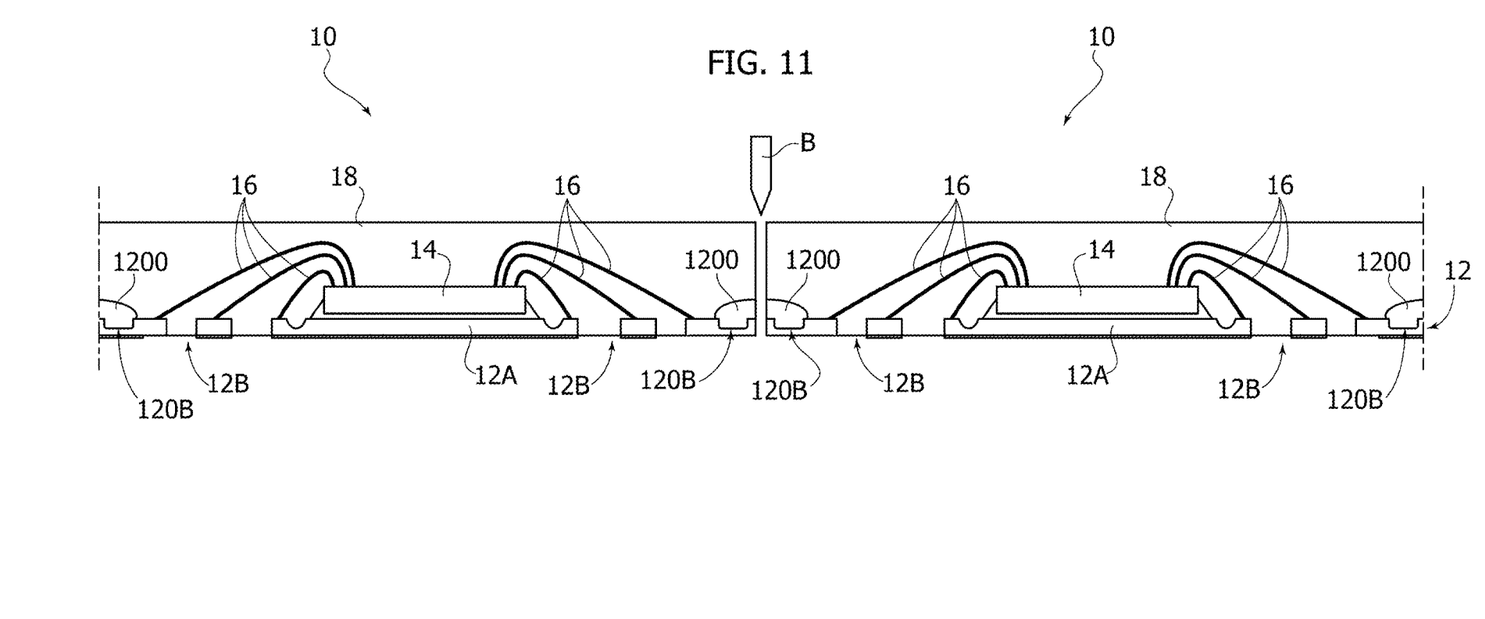
FIG. 11 illustrates possible method steps in embodiments according to the present description.

FIG. 11 is exemplary of a conventional singulation step (performed via a blade B, for instance) leading to the formation of individual (e.g., QFN) packages 10.

Those of skill in the art will otherwise appreciate that the sequence of steps or acts of FIGS. 3 to 11 is merely exemplary in so far as: one or more steps illustrated can be omitted and/or replaced by other steps; additional steps may be added; and one or more steps can be carried out in a sequence different from the sequence illustrated.

Various such possible alternatives of embodiments will now be discussed in connection with FIGS. 12A, 12B, 12C, and FIG. 13, plus FIGS. 14A to 14L and FIGS. 15 and 16.

For the sake of simplicity and ease of understanding, unless the context indicates otherwise, parts or elements like parts or elements already discussed in connection with FIGS. 1 to 11 are indicated in the following figures with like reference symbols, and a detailed description will not be repeated for brevity.

For simplicity, certain details possibly illustrated in FIGS. 1 to 11 may not be reproduced in the following figures.

Figure 12A:
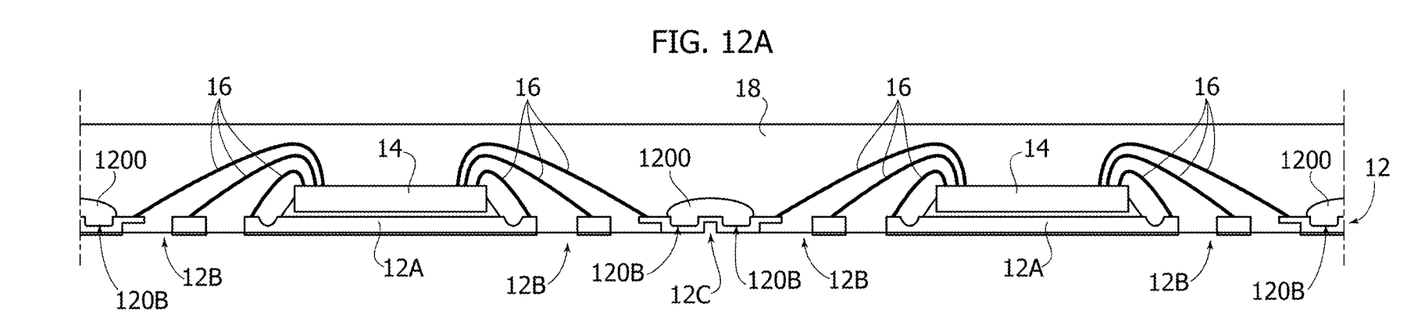
FIGS. 12A, 12B and 12C are illustrative of possible variants in method steps in embodiments according to the present description.
Figure 12B:
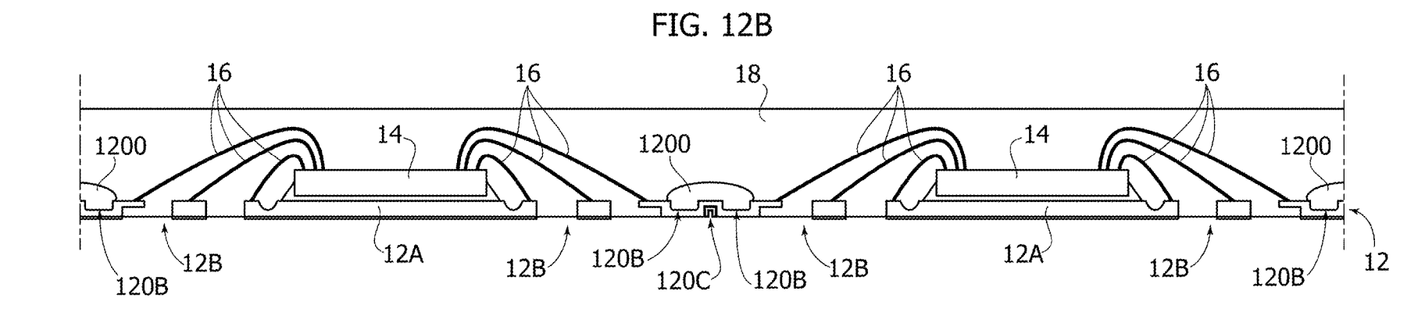
Figure 12C:
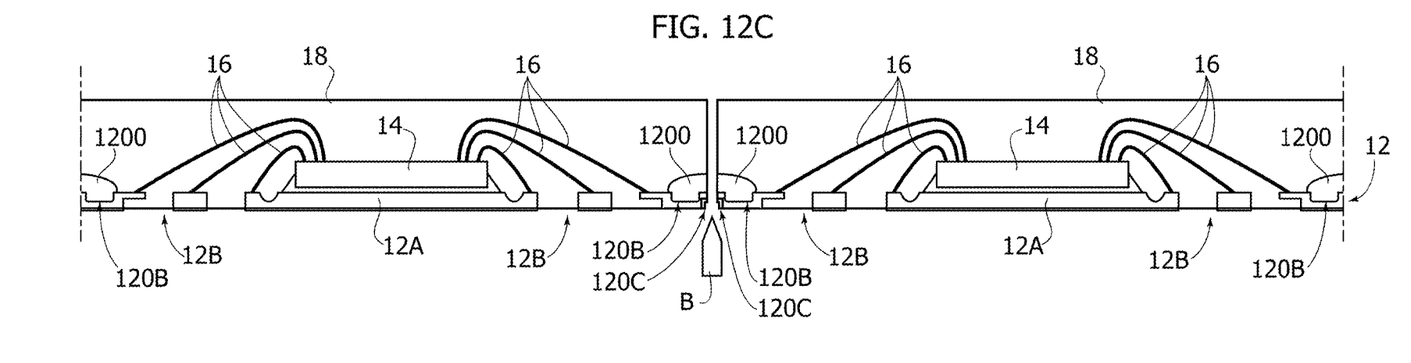
Figure 13:
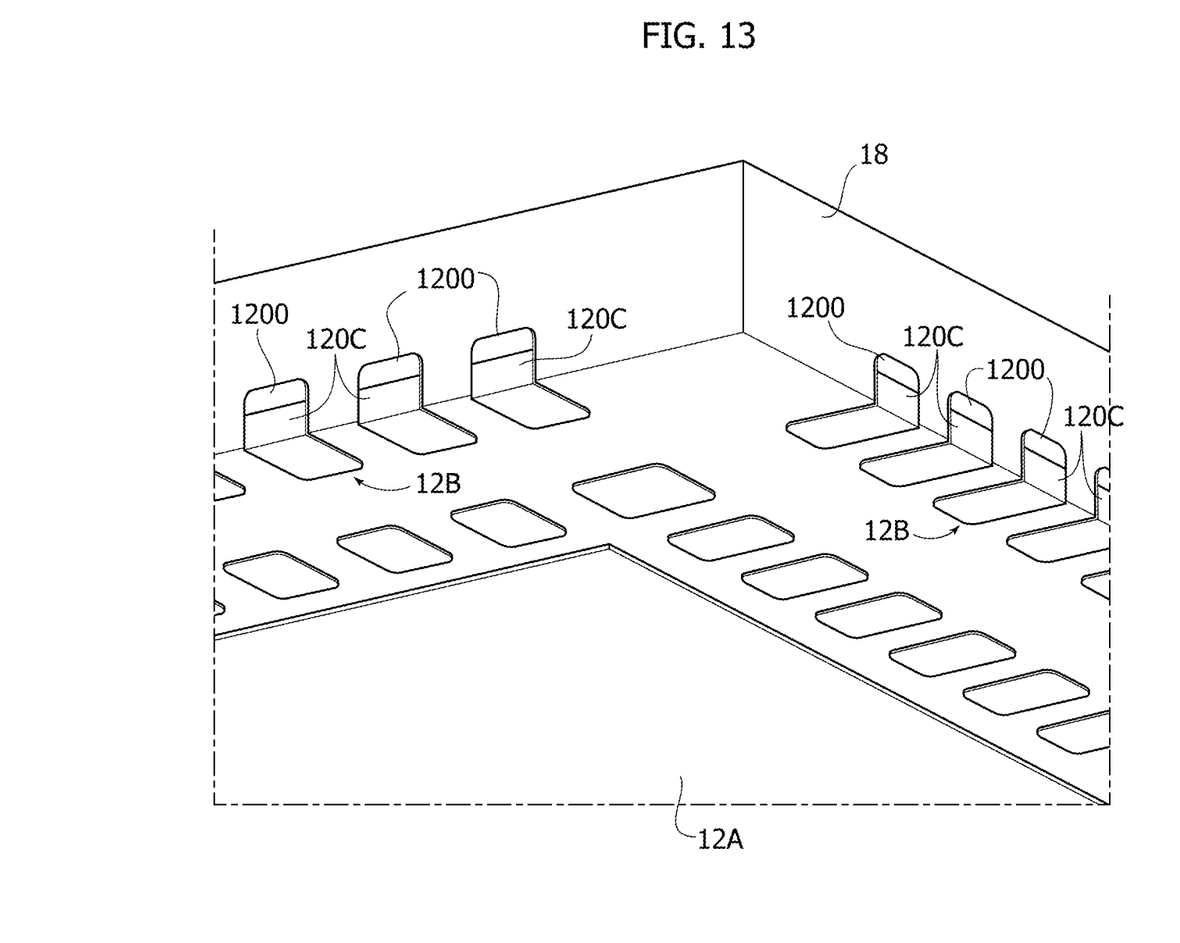
FIG. 13 is a perspective view illustrative of possible results of the variants of FIGS. 12A to 12C, FIGS. 14A to 14L are illustrative of another possible sequence of method steps in embodiments according to the present description.

The steps exemplified in FIGS. 12A, 12B and 12C contemplate a half cut 12C formed (in manner know per se—FIG. 12A) at the back or bottom side of the lead frame 12 (this is exemplified only at the central portion of the figures for simplicity) followed by (likewise conventional—FIG. 12B) plating at 120 C so that, after singulation (FIG. 12C), plated solder-wettable lead flanks become available as visible in FIG. 13.

FIGS. 14A to 14L are exemplary of the possibility of applying one or more embodiments to an (otherwise conventional) QFN-with-tape manufacturing process.

Those of skill in the art will again appreciate that the sequence of steps of FIGS. 14A to 14L is merely exemplary in so far as: one or more steps illustrated can be omitted and/or replaced by other steps; additional steps may be added; one or more steps can be carried out in a sequence different from the sequence illustrated.

Figure 14A:
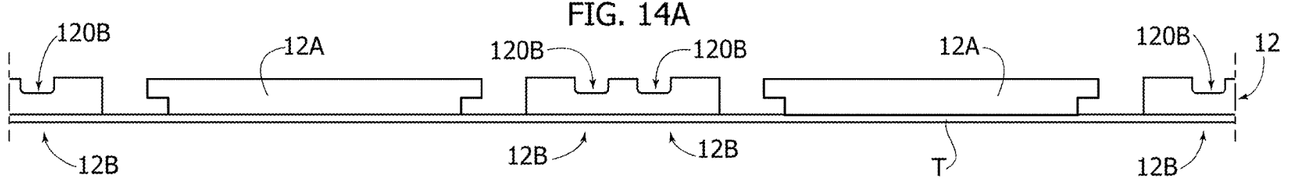
Figure 14B:
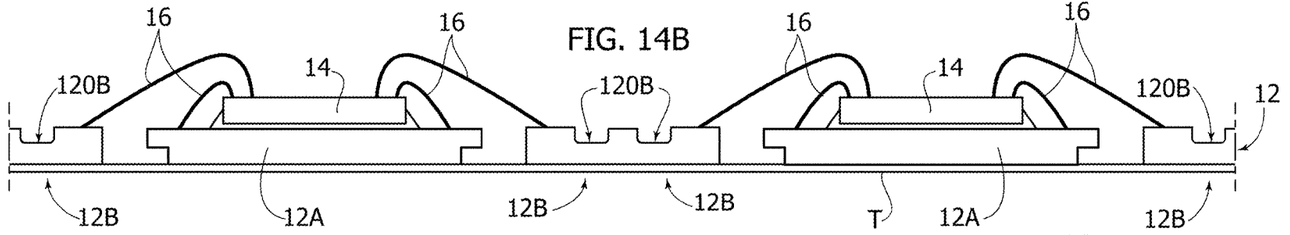
Figure 14C:
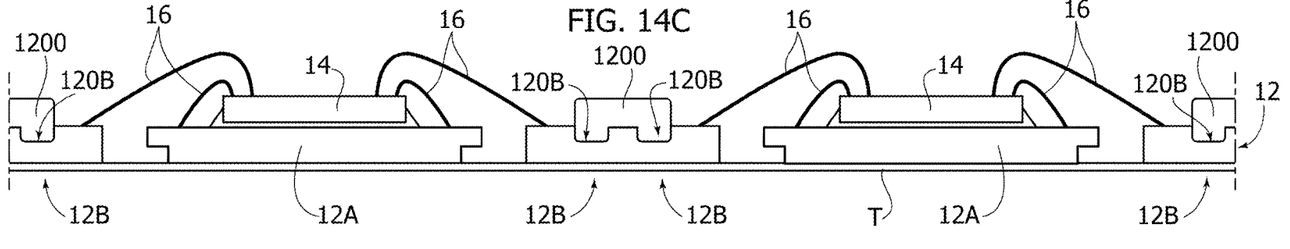
Figure 14D:
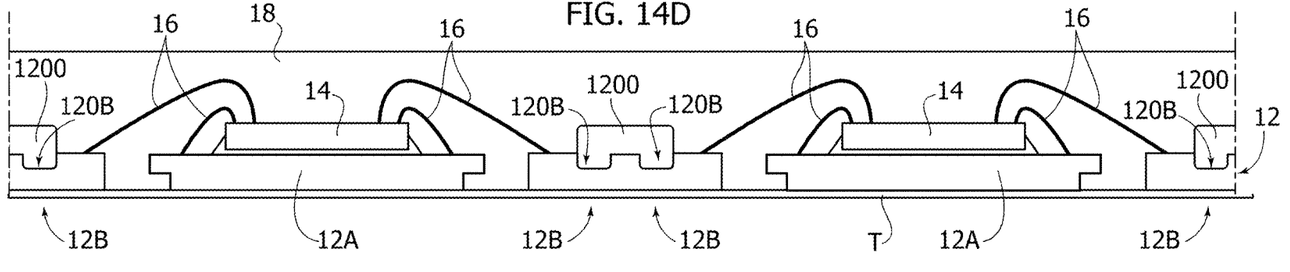
Figure 14E:
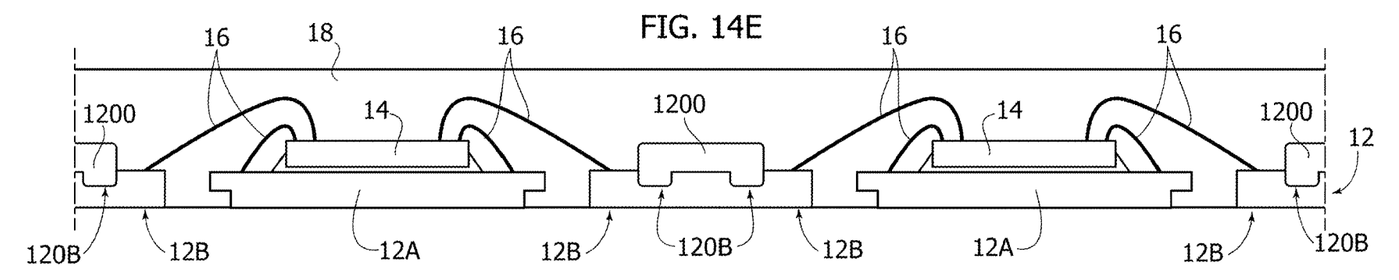
Figure 14F:
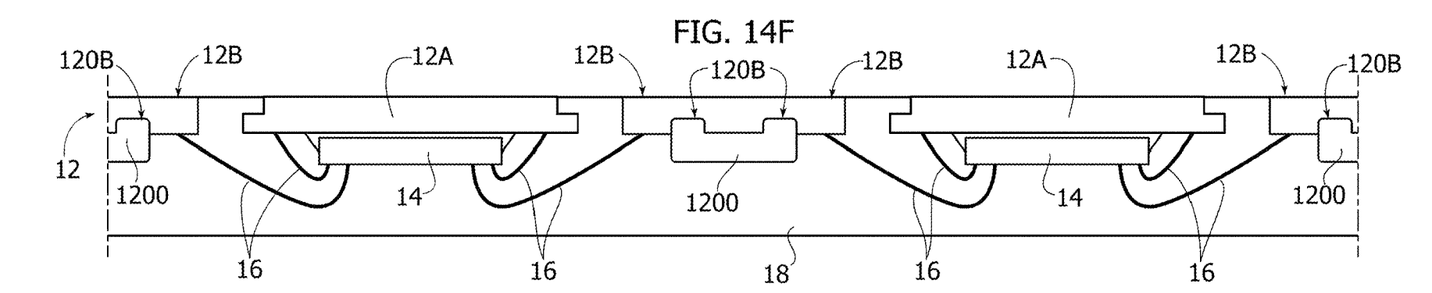
Figure 14G:
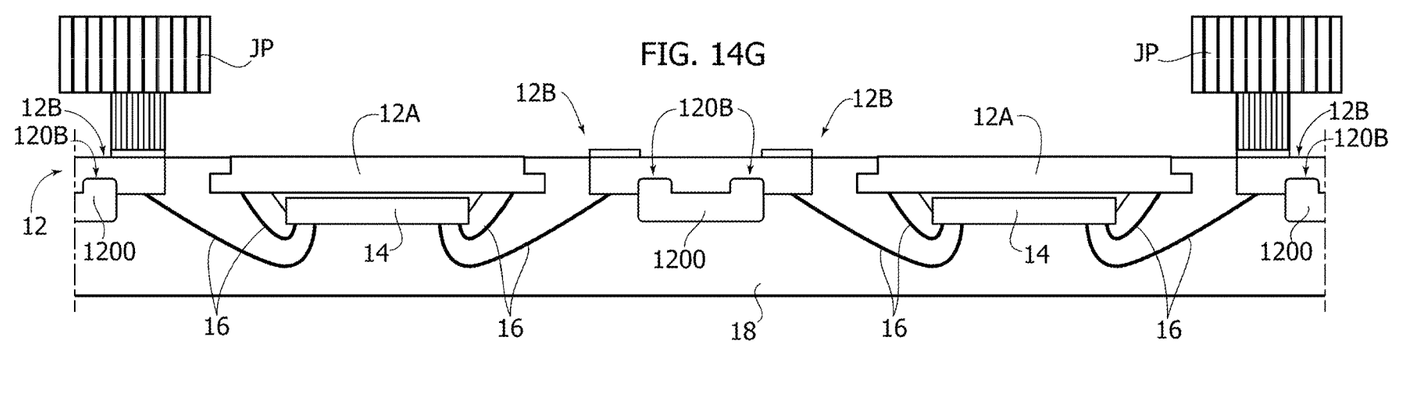
Figure 14H:
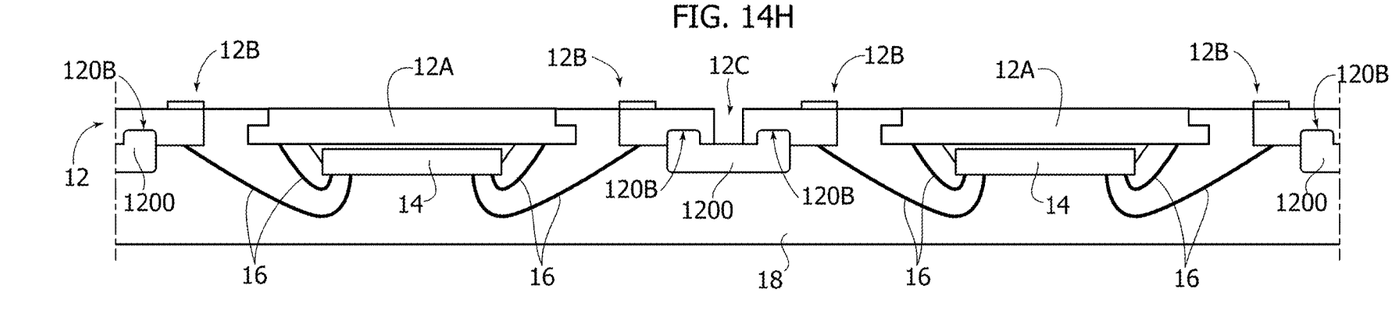
Figure 14I:
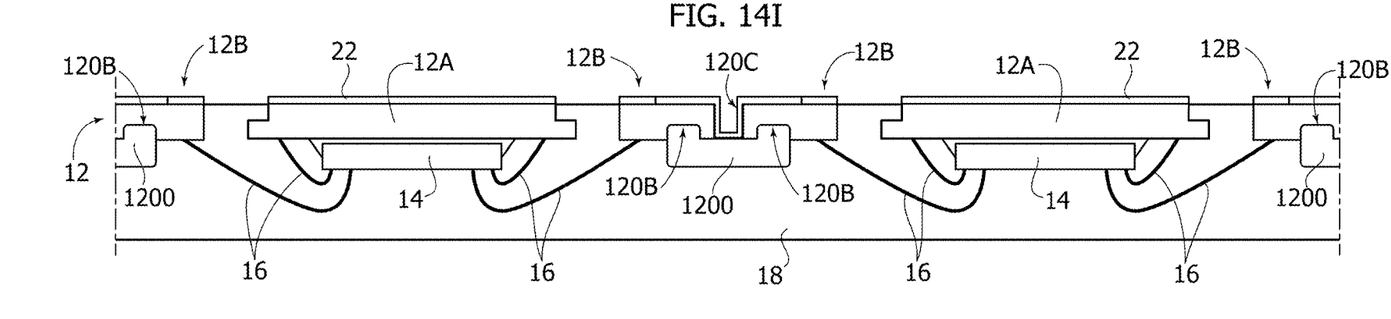
Figure 14J:
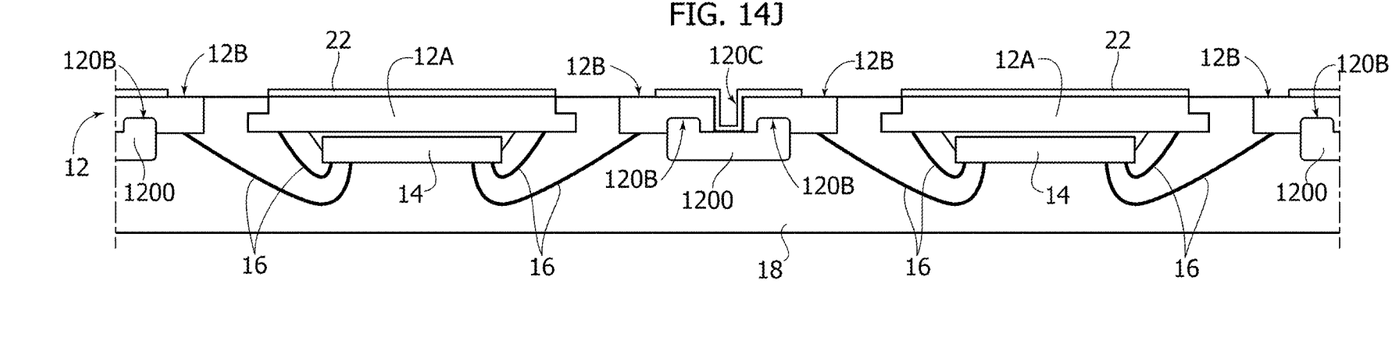
Figure 14K:
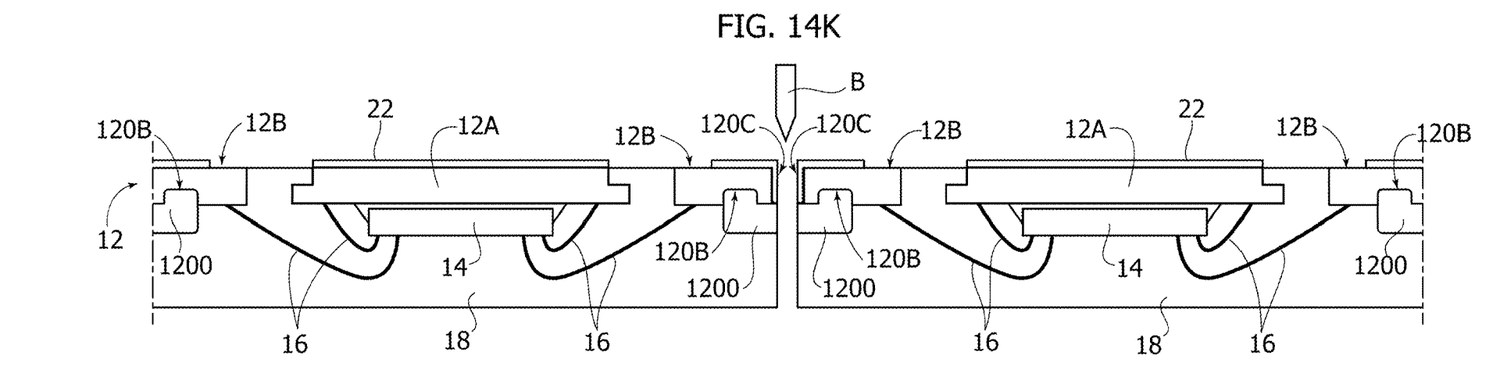

The steps of FIG. 14A to 14L include:

FIG. 14A—provision on a support tape T of a leadframe 12 with "half-etched" slots or notches 120B (again this does not necessarily imply that the slots 120B have a depth equal to half the thickness of the leadframe 12);

FIG. 14B—chips or dice 14 attached on the leadframe die pads 12A; wire bonding 16 provided between the chips or dice 14 and the leads 12B of the leadframe 12;

FIG. 14C—low elastic modulus material 1200 dispensed at slots or notches 120B;

FIG. 14D—package molding material 18 molded;

FIG. 14E—tape T removed;

FIG. 14F—assembly of FIG. 14E flipped (turned upside down);

FIG. 14G—water soluble mask application (e.g., via jet printing as exemplifies at JP) on contact lead portion corresponding to bonding area;

FIG. 14H—half cut at 12 C (see also FIG. 12A);

FIG. 14I—tin plating at 120 C (see also FIG. 12B);

FIG. 14J—water soluble mask removal;

FIG. 14K—singulation (blade B); and

Figure 14L:
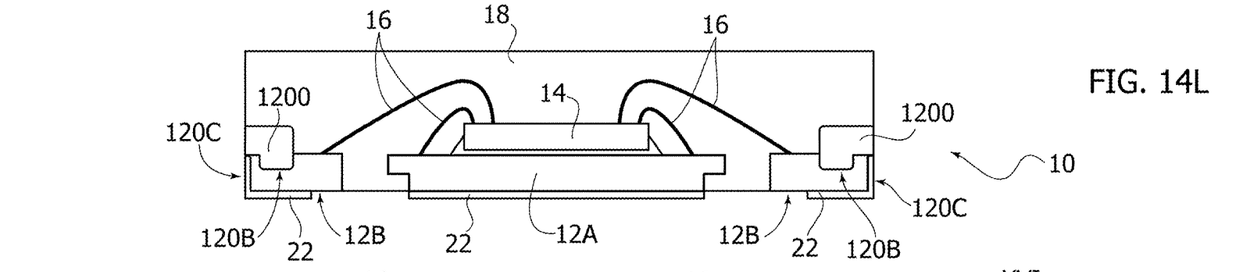

FIG. 14L—provision of individual device package 10 (e.g., QFN) with flexible flat contacts at the distal tips of the leads 12B.

Figure 15:
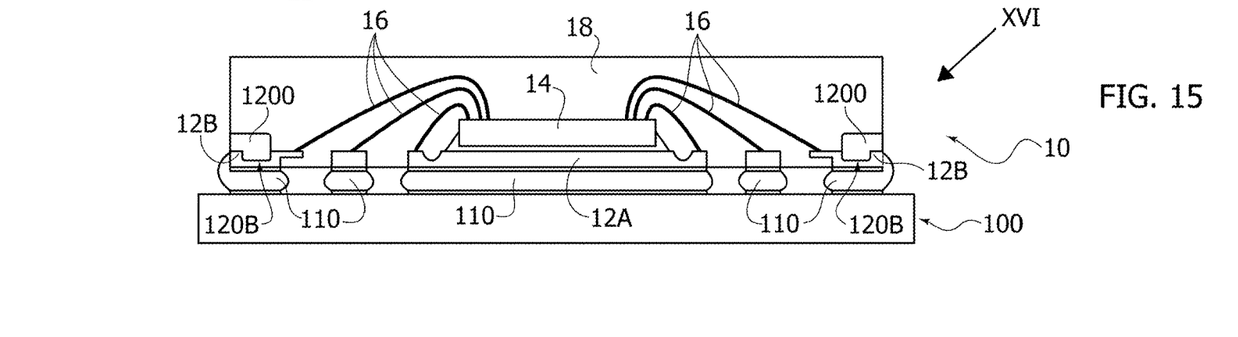
FIGS. 15 and 16 are illustrative of possible features of embodiments according to the present description.
Figure 16:
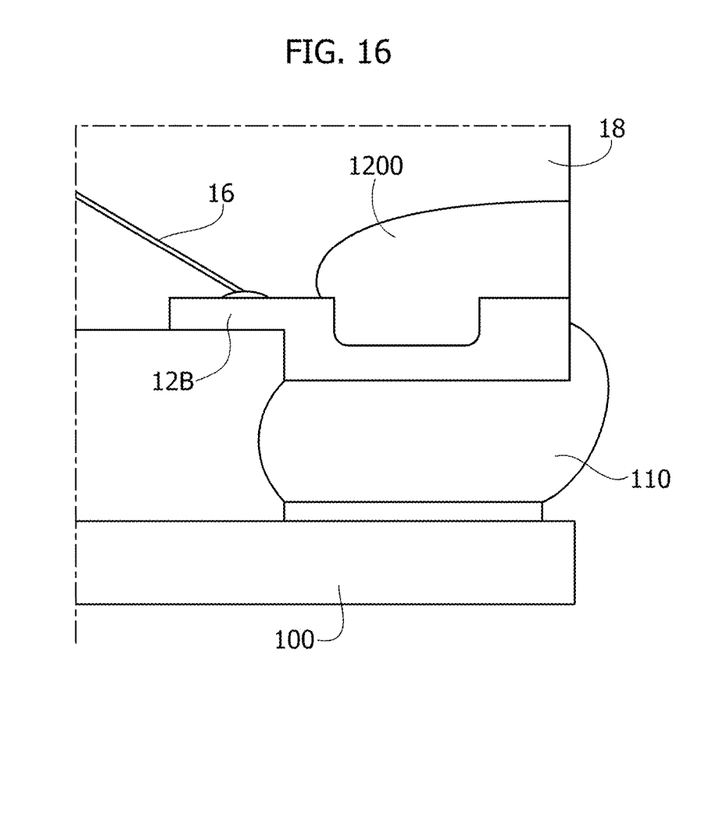

As exemplified in FIGS. 15 and 16, the low elastic module material 1200 embedded between the leads 12B and the molding material 18 effectively relieves thermomechanical stresses due to the (high) CTE mismatch between the module 10 and the substrate 100 (an IMS-card, for instance) which would otherwise be transferred to the solder joints 110.

The low elastic module material 1200 facilitates a sort of sealing effect of the modules thanks to improved adhesion to the substrate material (e.g., copper), which may be further improved by chemical compatibility with the mold material 14 and/or design of the slots 120B.

Figure 17:
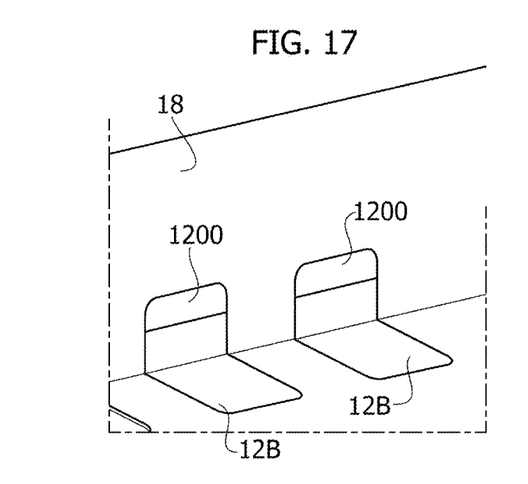
FIGS. 17 and 18 are illustrative of possible different features of embodiments according to the present description.
Figure 18:
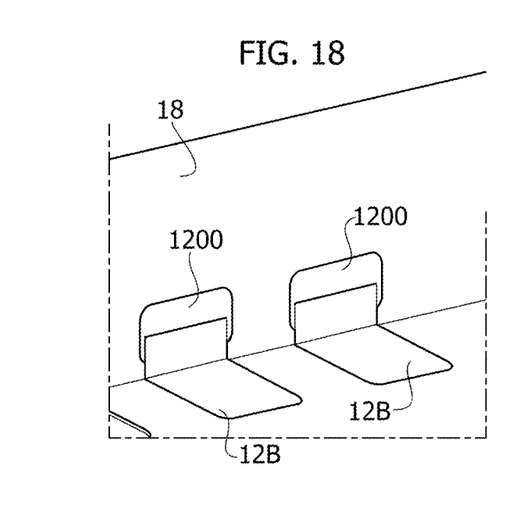

In this latter respect, FIGS. 17 and 18 are exemplary of the possibility of causing the "soft" cushion or pad provided by the low elastic module material 1200 to extend: (only) at the top or front surface of the leads 12B (FIG. 17), that is the surface opposed to the solder joints 110 and the substrate 100; and (also) at the sides of the leads 12B (FIG. 18), thus providing a sort of channel-shaped cushion or pad embracing leads 12B.

Normalized solder life simulation results for temperature cycles TC (−40/+125 C) based on a Finite Element Analysis (FEA) modelling have shown that packaging with flexible contacts as exemplified in FIGS. 17 and 18 may provide nearly 17% and 42% increase in solder life when applied to a QFNmr 10×10 mm package.

A method as exemplified herein may comprise:
  arranging at least one semiconductor chip (for instance, 14) on a (first) surface of a leadframe (for instance, 12) wherein the at least one semiconductor chip is arranged at a die pad (for instance, 12A) of the leadframe and the leadframe has an array of electrically-conductive leads (for instance, 12B) around the die pad, the leads in the array having distal ends facing away from the die pad as well as recessed portions (for instance, 120B) of said (first) surface of the leadframe at the distal ends of the leads in the array;
  forming (for instance, N) resilient material (for instance, 1200) at said recessed portions at the distal ends of the leads in the array; and
  molding onto the at least one semiconductor chip arranged on the leadframe an insulating encapsulation (for instance, 18) of the at least one semiconductor chip arranged on the leadframe, wherein the resilient material is sandwiched between the insulating encapsulation and the distal ends of the leads in the array at said recessed portions, wherein the resilient material facilitates flexibility of said leads at said distal ends.

A method as exemplified herein may comprise forming said recessed portions as slots in said distal ends.

In a method as exemplified herein said slots may open at said (first) surface of the leadframe.

In a method as exemplified herein, said recessed portions may comprise half-etched portions of the leadframe.

A method as exemplified herein may comprise:
  forming resilient material at said recessed portions at the distal ends of the leads in the array only at said surface of the leadframe (see FIG. 17, for instance); or
  forming resilient material at said recessed portions at the distal ends of the leads in the array both at said surface of the leadframe and at the sides of said leads (see FIG. 18, for instance).

In a method as exemplified herein, said resilient material may have a low elasticity modulus, that is, may consist essentially of low elasticity modulus material, optionally an elasticity modulus in the vicinity of 2 MPa.

In the case of a material which is applied in a flowable (molten) state and then consolidated—this may be the case of a curable (polymerizable) resin material, for instance—the elasticity modulus and Young modulus value are intended to refer to the material once cured (polymerized).

A method as exemplified herein may comprise:
providing an electrical bonding pattern (for instance, 16) between the at least one semiconductor chip and a bonding area of leads in the array at said (first) surface of the leadframe; and
providing a plated area (for instance, 24 in FIG. 9) at a second surface of the leadframe opposed said (first) surface, said plated area being located at the distal ends of the leads in the array and stopping before said bonding area of leads in the array at said (first) surface of the leadframe.

A device (for instance, 10) as exemplified herein may comprise:
at least one semiconductor chip (for instance, 14) arranged on a surface of a leadframe (for instance, 12) wherein the at least one semiconductor chip is arranged at a die pad (for instance, 12A) of the leadframe and the leadframe has an array of electrically-conductive leads (for instance, 12B) around the die pad, the leads in the array having distal ends facing away from the die pad as well as recessed portions (for instance, 120B) of said surface of the leadframe at the distal ends of the leads in the array;
resilient material (for instance, 1200) formed at said recessed portions at the distal ends of the leads in the array; and
an insulating encapsulation (for instance, 18) of the at least one semiconductor chip arranged on the leadframe, wherein the resilient material is sandwiched between the insulating encapsulation and the distal ends of the leads in the array at said recessed portions, wherein the resilient material facilitates flexibility of said leads at said distal ends.

In a device as exemplified herein, said recessed portions may comprise slots in said distal ends, optionally slots open at said surface of the leadframe.

In a device as exemplified herein, said recessed portions may comprise half-etched portions of the leadframe.

A device as exemplified herein may comprise:
resilient material formed at said recessed portions at the distal ends of the leads in the array only at said surface of the leadframe (see FIG. 17, for instance); or
resilient material formed at said recessed portions at the distal ends of the leads in the array both at said surface of the leadframe and at the sides of said leads (see FIG. 18, for instance).

In a device as exemplified herein, said resilient material may have a low elasticity modulus, that is may consist essentially of low elasticity modulus material, optionally an elasticity modulus in the vicinity of 2 MPa.

As indicated, in the case of a material which is applied in a flowable (molten) state and then consolidated—this may be the case of a curable (polymerizable) resin material, for instance—the elasticity modulus and Young modulus value are intended to refer to the material once cured (polymerized).

A device as exemplified herein may comprise:
an electrical bonding pattern (for instance, 16) between the at least one semiconductor chip and a bonding area of leads in the array at said (first) surface of the leadframe; and
a plated area (for instance, 24) at a (second) surface of the leadframe (12) opposed said (first) surface, said plated area being located at the distal ends of the leads in the array and stopping before said bonding area of leads in the array at said (first) surface of the leadframe.

Without prejudice to the underlying principles, the details and embodiments may vary, even significantly, with respect to what has been described by way of example only without departing from the extent of protection.

The claims are an integral part of the technical teaching on the embodiments as provided herein.

The extent of protection is determined by the annexed claims.

The invention claimed is:

1. A method, comprising:
arranging at least one semiconductor chip at a die pad of a leadframe which includes has an array of leads around the die pad, the leads having distal ends facing away from the die pad as well as recessed portions in upper surfaces thereof;
forming resilient material on said upper surfaces and filling said recessed portions of the leads; and
molding an insulating encapsulation on to the at least one semiconductor chip arranged on the leadframe;
wherein the resilient material is sandwiched between the insulating encapsulation and the distal ends of the leads at said recessed portions, said resilient material facilitating flexibility of said leads at said distal ends.

2. The method of claim 1, comprising forming said recessed portions as slots in said distal ends.

3. The method of claim 2, wherein said slots open at side surfaces of the leads.

4. The method of claim 1, wherein said recessed portions comprise half-etched portions of the leadframe.

5. The method of claim 4, further comprising performing an etch at a lower surface of the leadframe to define the leads, and where said etch is not performed at the lower surface opposite a location of the recessed portions.

6. The method of claim 1, wherein forming resilient material comprises not providing resilient material at sides of said leads.

7. The method of claim 1, wherein forming resilient material comprises providing resilient material at sides of said leads.

8. The method of claim 1, wherein said resilient material has an elasticity modulus in a vicinity of 2 MPa.

9. The method of claim 1, further comprising electrically bonding the at least one semiconductor chip to bonding areas at the upper surface of the leads.

10. The method of claim 9, further comprising providing a plated area at a lower surface of the leads opposed said upper surface.

11. A device, comprising:
a leadframe having a die pad and an array of electrically-conductive leads around the die pad, the leads having distal ends facing away from the die pad as well as recessed portions in an upper surface of the leads;
at least one semiconductor chip arranged at the die pad;
resilient material on said upper surfaces and filling said recessed portions of the leads; and
an insulating encapsulation on the at least one semiconductor chip arranged on the leadframe;

wherein the resilient material is sandwiched between the insulating encapsulation and the distal ends of the leads at said recessed portions, said resilient material facilitating flexibility of said leads at said distal ends.

12. The device of claim 11, wherein said recessed portions comprise slots in said distal ends.

13. The device of claim 12, wherein said slots open at side surfaces of the leads.

14. The device of claim 11, wherein said recessed portions comprise half-etched portions of the leadframe.

15. The device of claim 11, wherein the resilient material is not provided at side surfaces of the leads.

16. The device of claim 11, wherein the resilient material is provided at side surfaces of the leads.

17. The device of claim 11, wherein said resilient material has an elasticity modulus in a vicinity of 2 MPa.

18. The device of claim 11, further comprising an electrical bonding between the at least one semiconductor chip and a bonding area of leads at the upper surface.

19. The device of claim 18, further comprising a plated area at a lower surface of the leads opposed to said upper surface.

20. A method, comprising:
arranging at least one semiconductor chip on a surface of a leadframe, wherein the at least one semiconductor chip is arranged at a die pad of the leadframe and the leadframe has an array of electrically-conductive leads around the die pad, the leads in the array having distal ends facing away from the die pad as well as recessed portions in front surfaces of said distal ends of the leads in the array, wherein said recessed portions are spaced at a distance from extremities of said distal ends of the leads in the array;
forming resilient material at said recessed portions at the distal ends of the leads in the array, wherein the resilient material fills the recessed portions and covers the front surfaces of said distal ends of the leads; and
molding an insulating encapsulation onto the at least one semiconductor chip and the leadframe, wherein the resilient material is sandwiched between the insulating encapsulation and the distal ends of the leads in the array at said recessed portions, wherein the resilient material that covers the front surfaces of said distal ends of the leads is exposed at a side of the insulating encapsulation, and wherein the resilient material facilitates flexibility of said leads at said distal ends.

21. The method of claim 20, comprising forming said recessed portions as slots in said distal ends.

22. The method of claim 21, wherein said slots open at said surface of the leadframe.

23. The method of claim 1, wherein said recessed portions comprise half-etched portions of the leadframe.

24. The method of claim 1, wherein said resilient material has an elasticity modulus of about 2 MPa.

25. A device, comprising:
a leadframe having a die pad an array of electrically-conductive leads around the die pad, the leads in the array having distal ends facing away from the die pad as well as recessed portions in front surfaces of the distal ends of the leads in the array, wherein said recessed portions are spaced at a distance from extremities of the distal ends of the leads in the array;
at least one semiconductor chip arranged on a surface of die pad;
resilient material filling said recessed portions at the distal ends of the leads in the array and covering the front surfaces of the distal ends of the leads in the array; and
an insulating encapsulation covering the at least one semiconductor chip and the leadframe, wherein the resilient material is sandwiched between the insulating encapsulation and the distal ends of the leads in the array at said recessed portions, wherein the resilient material that covers the front surfaces of said distal ends of the leads is exposed at a side of the insulating encapsulation, and wherein the resilient material facilitates flexibility of said leads at said distal ends.

26. The device of claim 25, wherein said recessed portions comprise slots in said distal ends that are open at a surface of the leadframe.

27. The device of claim 25, wherein said recessed portions comprise half-etched portions of the leadframe.

28. The device of claim 25, wherein said resilient material has an elasticity modulus of about 2 MPa.

* * * * *